United States Patent [19]
Haerle

[11] Patent Number: 6,100,104
[45] Date of Patent: Aug. 8, 2000

[54] METHOD FOR FABRICATING A PLURALITY OF SEMICONDUCTOR BODIES

[75] Inventor: Volker Haerle, Waldetzenberg, Germany

[73] Assignee: Siemens Aktiengesellschaft, Munich, Germany

[21] Appl. No.: 09/157,649

[22] Filed: Sep. 21, 1998

[30] Foreign Application Priority Data

Sep. 19, 1997 [DE] Germany ............................ 197 41 442

[51] Int. Cl.⁷ .................................................. H01L 21/00
[52] U.S. Cl. ............................................. 438/33; 438/113
[58] Field of Search .................................. 438/33, 34, 46, 438/47, 68, 113, 503, 641, 674, 778, 779, 787, 791, 931

[56] References Cited

U.S. PATENT DOCUMENTS

| | | |
|---|---|---|
| 5,013,682 | 5/1991 | Plumton et al. . |
| 5,284,791 | 2/1994 | Sakada et al. . |
| 5,478,774 | 12/1995 | Ackley et al. . |

FOREIGN PATENT DOCUMENTS

| | | |
|---|---|---|
| 0 599 224 A1 | 6/1994 | European Pat. Off. . |
| 0 599 244 A1 | 6/1994 | European Pat. Off. . |
| 0743 727 A1 | 11/1996 | European Pat. Off. . |

OTHER PUBLICATIONS

Japanese Patent Abstract No. 05251738 (Toyotoshi), dated Sep. 28, 1993.
Japanese Patent Abstract No. 08046291 (Seiji), dated Feb. 16, 1996.
Japanese Patent Abstract No. 07122520 (Shuji), dated May 12, 1995.
Japanese Patent Abstract No. 09045987 (Toshiaki), dated Feb. 14, 1997.

*Primary Examiner*—Charles Bowers
*Assistant Examiner*—Keith Christianson
*Attorney, Agent, or Firm*—Herbert L. Lerner; Laurence A. Greenberg; Werner H. Stemer

[57] ABSTRACT

A plurality of semiconductor bodies are produced by first depositing a mask layer on a main surface of a substrate wafer. A plurality of windows are next formed in the mask layer such that the wafer surface is laid bare in the windows. A semiconductor layer sequence defining the semiconductor bodies functionally is then deposited onto the main surface in the windows. Finally, the wafer is divided and severed into individual semiconductor chips.

18 Claims, 3 Drawing Sheets

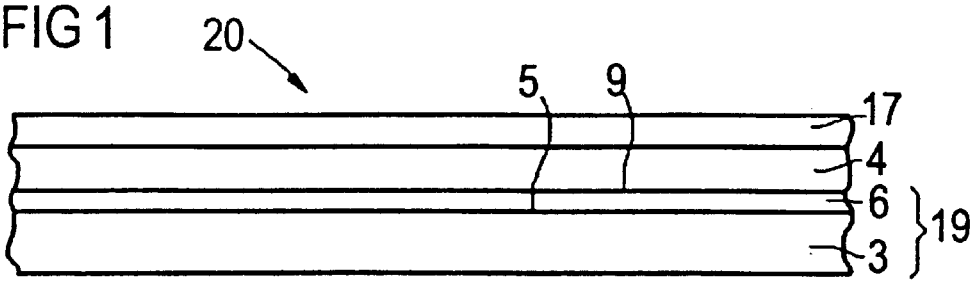
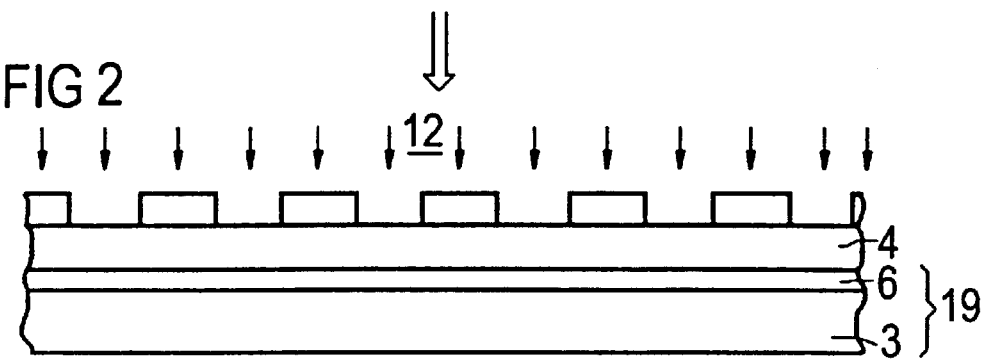
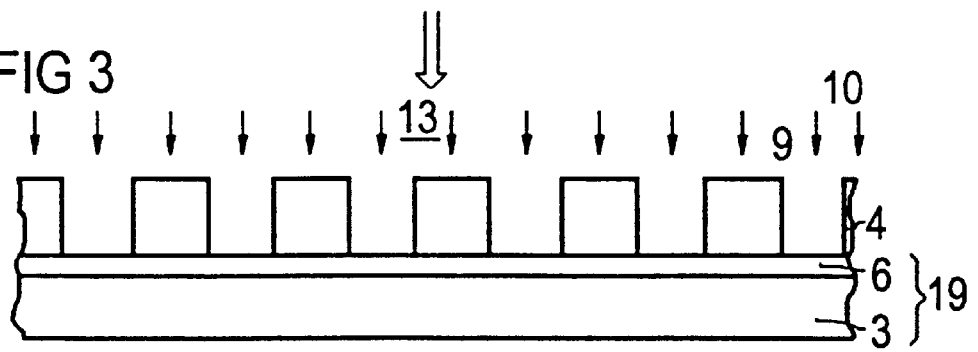
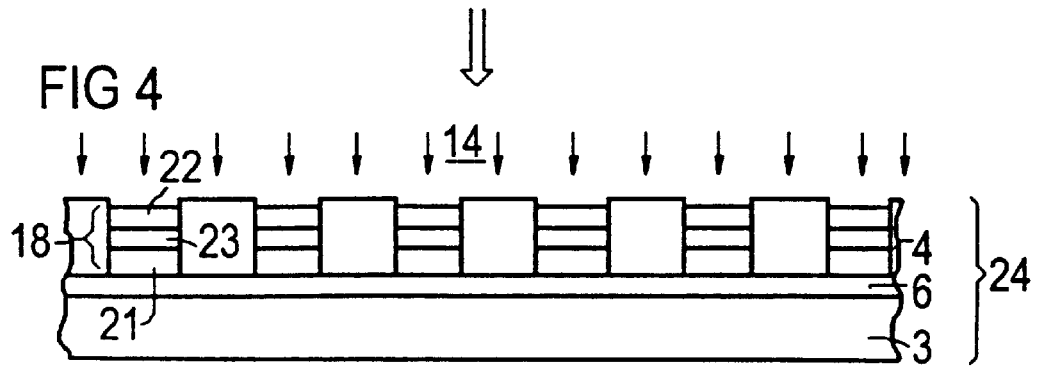

FIG 5
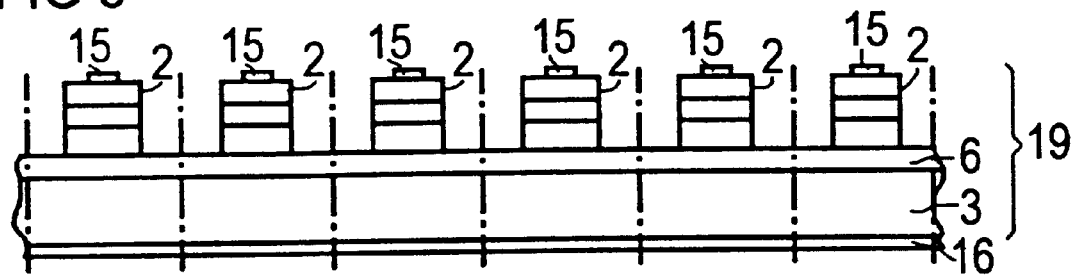
FIG 6
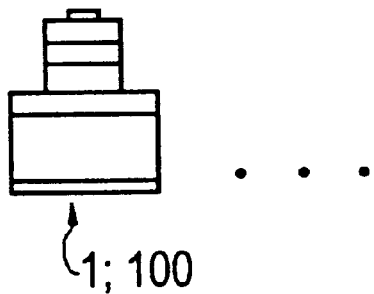
FIG 7
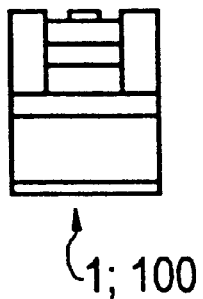

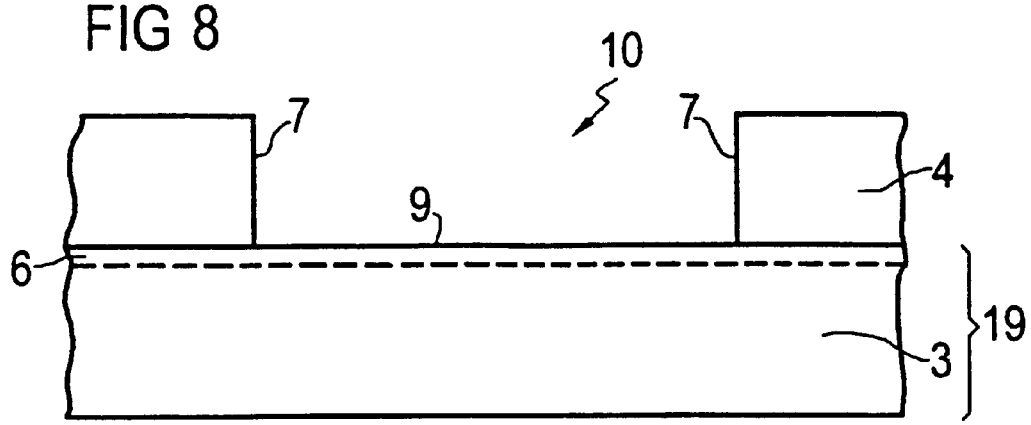
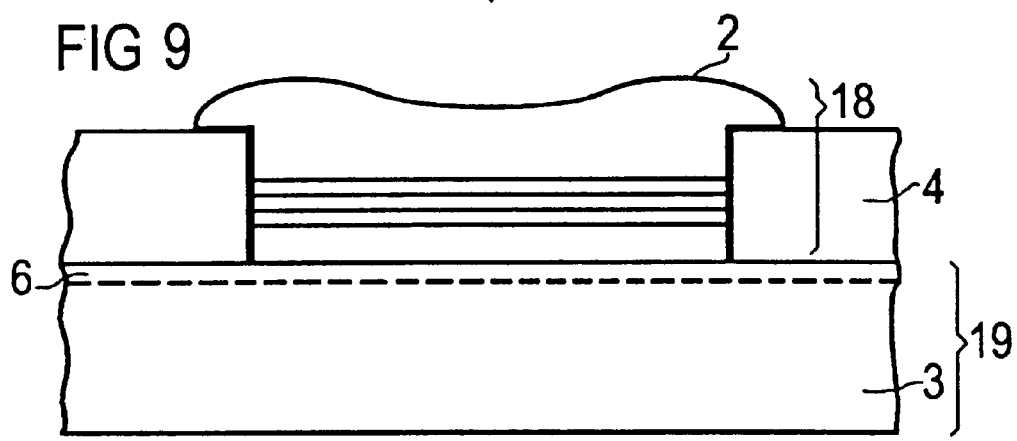
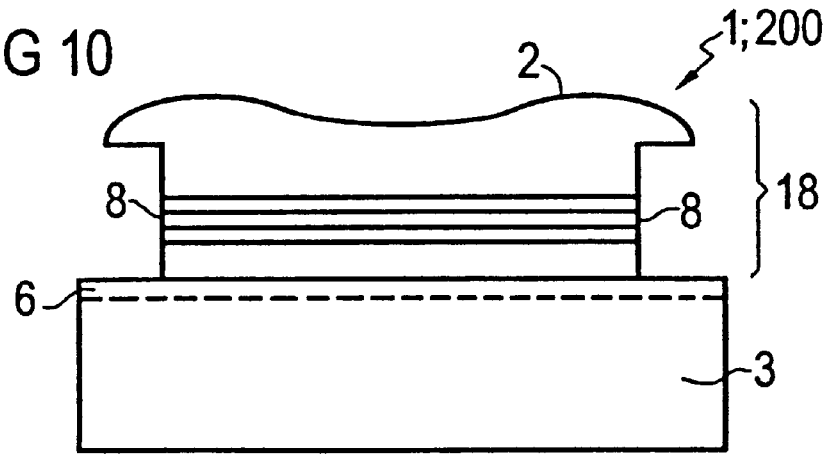

METHOD FOR FABRICATING A PLURALITY OF SEMICONDUCTOR BODIES

BACKGROUND OF THE INVENTION

Field of the Invention

The invention lies in the field of semiconductor manufacture. More specifically, the invention relates to a method for fabricating a plurality of semiconductor bodies, in particular of radiation-emitting semiconductor bodies, wherein a defined sequence of semiconductor layers is deposited on a main surface of a substrate wafer.

The invention relates, in particular:

- to a method for fabricating a plurality of light-emitting diode chips, in which a plurality of semiconductor layers are deposited on a main surface of a substrate wafer, and wherein at least one of the semiconductor layers includes a III-V compound semiconductor material based on GaN, such as, for example, GaN, GaAlN, InGaN, or InAlGaN; and
- to a method for fabricating a plurality of edge-emitting semiconductor laser chips which, on at least two mutually opposite side surfaces, have laser mirror surfaces lying plane-parallel to one another.

Methods of that type are known in the art. In order to fabricate light-emitting diode chips, for example, an electroluminescent semiconductor layer sequence is grown epitaxially on a semiconductor substrate wafer. The so-called epitaxial wafer is provided with the necessary contact metallization layers for making electrical contact with the light-emitting diode chips and then divided into light-emitting diode chips by means of sawing. Similar methods are used in transistor chips, IC chips, etc.

U.S. Pat. No. 5,578,839 to Nakamura et al. (corresponding to European EP 0 599 224 A1, and U.S. Pat. Nos. 5,734,182 and 5,747,832) describes a method in which a plurality of $In_xGa_{1-x}N$ layers are deposited epitaxially on a substrate. The plurality of $In_xGa_{1-x}N$ layers forms a light-emitting diode (LED) layer sequence which extends over the entire wafer. After the deposition of the LED layer sequence, the structuring thereof by means of etching, and the application of a plurality of contact metallization layers, the wafer is divided and severed into a multiplicity of individual light-emitting diode chips by cutting through the wafer between the contact metallization layers by means of sawing, for example.

During the deposition of Ga(In,Al)N light-emitting diode structures, a particular problem exists, independently of the substrate material: the lattice constants of the nitrides differ greatly from the corresponding substrates. A further difficulty is posed by the greatly different thermal expansion coefficients of the available substrate materials (e.g. sapphire or SiC) and of the Ga(In,Al)N system. The effect of the different thermal expansions caused thereby is that when the wafer cools down from the growth temperature to room temperature, thermally induced stresses occur in the wafer. This leads to defects in the semiconductor structures, primarily cracks, holes, etc., which have a lasting adverse effect on the component properties such as ESD stability, service life, and the like.

The system Ga(In,Al)N is to be understood to mean $Ga_{1-x-y}In_xAl_yN$ where $0 \leq x < 1$, $0 \leq y < 1$ and $x+y < 1$.

A further problem in the context of Ga(In,Al)N light-emitting diode structures arises from the fact that the material system is highly stable in chemical terms. That property gives rise to major problems in the course of component structuring. Structuring of the Ga(In,Al)N layer sequences on the wafer is possible only by means of technically complicated methods, such as dry etching processes or UV-assisted wet-chemical etching processes.

In addition, sapphire and GaN, for example, can be sawn only with great technical outlay on account of their considerable hardness.

In a known method for fabricating edge-emitting laser diodes, the laser mirrors are realized, for example, by cleaving an epitaxial semiconductor wafer having the laser diode structures along the crystallographic directions of the substrate.

The fabrication of semiconductor bodies composed of a very wide variety of semiconductor materials on very different substrate crystals allows less and less the use of crystallographic directions of the substrate for producing laser mirrors by simple cleaving. Complicated techniques such as wet or dry etching processes therefore become necessary in order to realize laser mirrors in an exactly plane-parallel alignment and with little roughness. Various semiconductor material systems such as, for example, Ga(In,Al)N even have the property of being resistant to customary wet-chemical etching. In those cases, one has to rely completely on technically complicated and hence expensive dry etching processes.

SUMMARY OF THE INVENTION

It is accordingly an object of the invention to provide a method of fabricating a plurality of semiconductor bodies, which overcomes the above-mentioned disadvantages of the heretofore-known methods of this general type and which enables a plurality of semiconductor bodies with precisely defined side surfaces and/or reduced crystal defects to be fabricated in a simple manner, even where semiconductor materials are used that are highly stable in mechanical and chemical terms and/or substrate and epitaxial layer materials are used with lattice constants that differ greatly from one another.

It is a particular object of the invention to specify a method for fabricating Ga(In,Al)N light-emitting diode chips which enables crystal defects in the semiconductor structures to be reduced and in which technically simple methods for structuring Ga(In,Al)N layer sequences can be employed.

Furthermore, it is an object to specify a simple method for fabricating laser mirrors of an edge-emitting laser semiconductor body, in particular comprising various semiconductor layers from the material system Ga(In,Al)N.

With the foregoing and other objects in view there is provided, in accordance with the invention, a method of fabricating a plurality of semiconductor chips, in particular radiation-emitting semiconductor chips. The method comprises the following steps:

- depositing a mask layer on a main surface of a substrate wafer;
- forming a plurality of windows in the mask layer and uncovering the main surface of the substrate wafer within the windows;
- depositing a semiconductor layer sequence onto the main surface of the substrate wafer in the windows and forming substantially identical functional semiconductor structures in the windows; and
- dividing the wafer with the semiconductor layer sequence into a plurality of semiconductor chips by severing the wafer between the semiconductor structures.

The invention is applicable, in particular, to the preferred methods of fabricating Ga(In,Al)N light-emitting diode chips and of fabricating edge-emitting Ga(In,Al)N semiconductor laser chips.

In the preferred process sequence, a readily etchable mask layer is first formed on the substrate wafer. The mask layer is subsequently provided with a plurality of mask openings (windows), for example by means of a photographic technique, in which windows the main surface of the substrate wafer is laid bare. The semiconductor layer sequence of light-emitting diode structures or of semiconductor laser structures is subsequently deposited on the main surface of the substrate wafer in the windows. The windows in this case define the lateral form of the semiconductor layer sequence. After contact metallization layers have been applied to the wafer fabricated in such a way, the wafer is separated into individual light-emitting diode chips or semiconductor laser chips.

The mask layer is advantageously formed of a dielectric layer made of $SiO_2$ or $Si_xN_{1-x}$ and the windows are produced for example by means of an isotropic wet-chemical etching process (for example with a conventional window etching solution) or by means of a dry-chemical etching process, which is preferably selective with respect to the substrate material.

In accordance with an added feature of the invention, a Ga(In,Al)N semiconductor layer sequence is deposited onto the main surface of the substrate wafer in the windows, and Ga(In,Al)N light-emitting diode structures are produced in the windows. The dividing step thereby comprises dividing the wafer into a plurality of Ga(In,Al)N light-emitting diode chips by severing the wafer between the Ga(In,Al)N light-emitting diode structures.

The method is particularly advantageously used in the case of semiconductor bodies in which the substrate is composed of SiC, sapphire or GaN and in which the semiconductor layer sequence has at least one semiconductor layer made of the material system Ga(In,Al)N.

In accordance with an additional feature of the invention, the step of depositing a semiconductor layer structure comprises depositing a VCSEL semiconductor layer sequence onto the main surface of the substrate wafer in the windows and producing VCSEL structures in the windows, and wherein the dividing step comprises dividing the wafer into a plurality of VCSEL chips by severing the wafer between the VCSEL structures.

In accordance with another feature of the invention, a plurality of edge-emitting semiconductor laser chips are formed, on two mutually opposite side surfaces, with laser mirror surfaces extending plane-parallel to one another and being defined by two mutually opposite, plane-parallel side surfaces of a respective window.

The semiconductor structures are, in particular, light-emitting diode structures or semiconductor laser structures. The latter include edge-emitting laser diodes and VCSEL (Vertical Cavity Surface Emitting Laser) diodes having at least one semiconductor layer made of the material system of the III-V compound semiconductors based on GaN, such as, for example, $Ga_{1-x-y}In_xAl_yN$ where $0 \leq x < 1$, $0 \leq y < 1$, and $x+y<1$.

The above-noted problems upon which the invention is based are particularly prevalent in the context of these materials and components.

The component are, for example, laser diodes which emit blue or green light and in which an edge-emitting laser semiconductor structure is provided as the semiconductor layer sequence, which laser semiconductor structure has, on two mutually opposite side surfaces, laser mirror surfaces which lie plane-parallel to one another. In the method according to the invention, the laser mirrors are defined by two side surfaces of the mask openings, which side surfaces lie opposite one another in an exactly plane-parallel manner.

In accordance with again an added feature of the invention, a substrate wafer is provided with at least one epitaxially applied semiconductor layer, onto which the semiconductor layer sequence is deposited in the windows during the step of depositing the semiconductor layer structure.

In accordance with again an additional feature of the invention, the mask layer is formed of a material selected from the group consisting of $SiO_2$ and $Si_xN_{1-x}$.

In accordance with again another feature of the invention, the substrate wafer is formed with a growth substrate composed essentially from a material selected from the group consisting of sapphire, SiC, GaN, AlN, Si, and GaAs.

In accordance with again a further feature of the invention, the semiconductor structures are formed with at least one semiconductor layer from the material system Ga(In,Al)N.

In accordance with yet an added feature of the invention, the substrate wafer is formed with at least one epitaxially applied semiconductor layer essentially composed of $Ga_xAl_{x-1}N$, whereby $0 \leq x \leq 1$.

In accordance with yet an additional feature of the invention, particularly in the course of fabricating edge-emitting semiconductor laser chips, the mask layer is removed prior to the severing step. Furthermore, the mask layer may be removed after the step of depositing the semiconductor structures by etching selectively with respect to the semiconductor structures. The mask layer may be removed with an isotropic wet-chemical etching process after the step of depositing the semiconductor structures.

In order to separate the wafer produced in this way into individual chips, only the mask layer (if this has not been removed beforehand), the substrate wafer and, if appropriate, a contact metallization layer applied on the rear side (=the main surface of the substrate wafer which is remote from the light-emitting diode structures) will be cut through between the light-emitting diode structures. As a result, in this method there is advantageously no damage to the semiconductor layer sequences in the course of sawing and/or breaking of the wafer.

In addition, in the event of fabricating light-emitting diode chips, it may be advantageous to remove the mask layer situated between the light-emitting diode structures before the wafer is separated into light-emitting diode chips, with the result that individual, mutually separate light-emitting diode structures remain on the substrate. Afterwards, it is then necessary only to cut through the substrate wafer and, if appropriate, a contact metallization layer on the rear side thereof between the light-emitting diode structures.

This optional removal of the mask layer after the deposition of light-emitting diode structures is carried out, for example, by means of a wet-chemical etching process in which the light-emitting diode structures are not eroded at all, or are eroded only to a very small extent.

One advantage of the method consists, on the one hand, in the fact that the form and dimension of the subsequent light-emitting diode chips or semiconductor laser chips are defined prior to the epitaxy of the semiconductor layer sequence of these chips, as a result of which it is possible to leave out a number of process steps compared with known methods.

On the other hand, the novel method advantageously enables the deposition of greatly stressed structures in the predefined windows. The deposited crystal in this case has the opportunity to expand in three spatial directions and, consequently, to relieve the potential stress energy in bulk, without having to form corresponding dislocations.

Furthermore, it is advantageous that fewer defects are incorporated in the crystal since stresses in the crystalline layers can already be relieved during the growth.

In the case of the known planar epitaxy, without a mask (described above), defects are produced in the crystal in order to relieve the potential stress energy. These defects have a lasting adverse effect on the subsequent component in a manner such that, for example, the service life is shortened and/or the ESD stability is distinctly reduced. A reduction in the defects by means of the method according to the invention accordingly expresses itself directly in an improvement in these component properties.

An essential feature of the present method consists in the selective deposition of the light-emitting diode structures or semiconductor laser structures in the mask openings (windows). The mask layer and also the deposition conditions can be chosen in such a way that epitaxial, that is to say monocrystalline, deposition of Ga(In,Al)N material is not carried out on the mask.

This method can be applied both to sapphire and to SiC, Si, GaAs, GaN, AlN, etc., as growth substrate material. Many difficulties which occur when breaking or etching wafers fabricated by means of planar epitaxy, in particular Ga(In,Al)N epitaxial wafers for fabricating a very wide variety of light-emitting diode or semiconductor laser chips, are circumvented by this method.

In a preferred embodiment of the method, a buffer layer, for example composed of Ga(In,Al)N, is grown prior to the application of the mask layer on a growth substrate wafer. The mask layer and the semiconductor layer sequences for the light-emitting diode structures or semiconductor laser structures are then deposited on said buffer layer in subsequent process steps. This can advantageously improve the growth conditions for the semiconductor layer sequences.

An essential advantage of the method according to the invention when fabricating edge-emitting semiconductor laser chips consists in the fact that the definition of the laser mirrors already takes place before the epitaxial deposition of the semiconductor layer sequence. In this case, the mask layer preferably has at least a thickness which corresponds to the light-guiding region of the envisaged laser semiconductor body and is settled vertically in the region of light genesis in the envisaged laser semiconductor body. With the aid of wet- or dry-chemical etching processes, the laser mirrors and, where possible, all other necessary boundaries of the semiconductor layer sequence are etched into this layer, it being necessary to ensure the sharpest possible etching edges and smooth etching sidewalls. The subsequent lateral form of the semiconductor layer sequence of the semiconductor laser chip is already defined in its geometrical ratios during this process.

The substrate material is uncovered in the resulting etching windows and serves as substrate surface for a subsequent epitaxy. The laser structure, in particular the light-guiding and also the active region of the laser semiconductor body, is then produced by means of selective epitaxy, in which the semiconductor materials of the semiconductor layer sequence are deposited only on the surface of the substrate wafer in the windows.

Following conclusion of the epitaxy, the readily etchable layer is removed wet-chemically or dry-chemically by etching with suitable chemicals. The structure produced as a result then already has the geometrical contours of the laser semiconductor body with very well defined laser mirrors.

Other features which are considered as characteristic for the invention are set forth in the appended claims.

Although the invention is illustrated and described herein as embodied in a method for fabricating a plurality of semiconductor bodies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 6 are diagrammatic side views illustrating a process sequence for fabricating light-emitting diodes (first exemplary embodiment);

FIG. 7 is a diagrammatic side view of a light-emitting diode chip fabricated in accordance with the invention (second exemplary embodiment); and FIGS. 8 to 10 are diagrammatic side views of a process sequence for fabricating an edge-emitting laser semiconductor body (third exemplary embodiment).

DESCRIPTION OF THE PREFERRED EMBODIMENTS:

Identical or functionally identical constituents are each provided with the same reference symbols through the figures.

Exemplary Embodiment according to FIGS. 1–6:

Referring now to the figures of the drawing in detail and first, particularly, to FIGS. 1 to 6 thereof, an electrically conductive semiconductor layer 6 (for example a buffer layer) composed, for example, of GaN and/or AlGaN is first applied to a main surface 5 of a growth substrate wafer 3, preferably composed of SiC, for example by means of MOVPE (metal organic vapor phase epitaxy). A mask layer 4, for example composed of $SiO_2$ or $Si_xN_{1-x}$, is subsequently formed on the substrate wafer 19 comprising the growth substrate 3 and the semiconductor layer 6. A photoresist layer 17 is deposited on the mask layer. The wafer 20 fabricated in this way is illustrated diagrammatically in FIG. 1.

After a conventional photopatterning of the photoresist layer 17, the mask layer 4 is provided with a plurality of mask openings 10 (windows) for example in a manner known per se by means of an isotropic wet-chemical (for example photo-etching solution) or by means of a dry-chemical etching process 12 (FIG. 2) which is preferably selective with respect to the material of the semiconductor layer 6. The main surface 9 of the semiconductor layer 6 that is remote from the growth substrate 3 is thereby uncovered within the mask openings 10 (FIG. 3).

In a subsequent process step, a Ga(In,Al)N semiconductor layer sequence 18 (FIG. 4), comprising a plurality of Ga(In, Al)N layers, is selectively epitaxially deposited onto that main surface 9 of the semiconductor layer 6 which is uncovered in the windows 10, for example by means of metal organic vapor phase epitaxy (MOVPE) 13 (FIG. 3). "Selectively epitaxially" is to be understood in this context such that the semiconductor material of the light-emitting diode structure is deposited epitaxially, that is to say in monocrystalline fashion, only on the main surface 9 of the semiconductor layer 6 and not on the mask layer 4. Only polycrystalline growth takes place, if any, on the mask layer 4.

The Ga(In,Al)N semiconductor layer sequence 18 has, for example, a light-emitting active layer 23 which is arranged between an n-doped 21 and a p-doped $Ga_yAl_{1-y}N(0<y<1)$ enclosing layer 22 and is composed of n-doped $In_xGa_{1-x}N$ $(0<y<1)$ The compositions, layer thicknesses, dopings, etc., of the individual layers of Ga(In,Al)N semiconductor layer sequences 18 for light-emitting diode chips 100 are known in semiconductor technology and are therefore not explained in further detail at this point. The same applies to the etching processes for the isotropic and anisotropic etching of $SiO_2$ and $Si_xN_{1-x}$.

After the selective epitaxy of the Ga(In,Al)N semiconductor sequence 18, the mask layer 4 is, as illustrated in FIG. 4, removed by means of wet-chemical or dry-chemical etching 14, which is selective with respect to the Ga(In,Al)N semiconductor layer sequence 18, from the present wafer 24 (more precisely from the main surface 9 of the semiconductor layer 6), with the result that free-standing light-emitting diode structures 2 remain on the substrate wafer 19 (FIG. 5).

In order to make contact with the light-emitting diode structures 2, it is necessary, as shown in FIG. 5, to additionally apply front-side contact metallization layers 15 to them. This step is advantageously carried out before the removal of the mask layer 4, for example by means of phototechnology and metallization. For this purpose, a metallization process which is conventional in semiconductor technology can once again be used.

Likewise, that side of the substrate wafer 3 which is remote from the light-emitting diode structures 2 is provided with a rear-side contact metallization layer 16 before or after the processing of the light-emitting diode structures 2.

The substrate wafer 19 with rear-side contact metallization layer 16 is then severed along lines between the light-emitting diode structures 2, resulting in individual light-emitting diode chips 100 (FIG. 6).

In the method according to the invention, a semiconductor layer 6 does not necessarily have to be applied to the growth substrate 3 before the application of the mask layer 4. Rather, the mask layer 4 can be deposited directly onto the main surface 5 of the growth substrate 3, which then solely forms the substrate wafer 19. The selective epitaxy of the light-emitting diode structures 2, if appropriate including buffer layer, is then carried out after the production of the windows 10 in the mask layer 4 likewise on the main surface 5 of the growth substrate 3.

VCSEL (Vertical Cavity Surface Emitting Laser) chips can be fabricated in a similar manner.

Exemplary embodiment according to FIG. 7:

Here, the mask layer 4 is not removed before the wafer 24 is separated into individual light-emitting diode chips 100. The result is that the light-emitting diode chips 100, as illustrated in FIG. 7, are provided with the mask layer 4 besides the light-emitting diode structure 2 after the severing of the wafer. This advantageously enables an etching step to be saved.

Exemplary embodiment according to FIGS. 8–10:

First, a mask layer 4 is applied to the whole area of a main surface 9 of a substrate wafer 19, on which a semiconductor layer 6 may already be applied (indicated by a dashed line in the figures). The growth substrate 3 is composed for example of SiC or sapphire and the mask layer 4 of $SiO_2$ or $Si_xN_{1-x}$. The semiconductor layer 6 is, if appropriate, an $Al_cGa_{1-x}N$ epitaxial layer $(0 \leq x \leq 1)$, for example, and serves as buffer layer, for example.

A plurality of windows 10 (for example round, rectangular, square recesses or trenches) are subsequently formed, for example by means of wet or dry etching in the mask layer 4, in which windows the main surface 9 of the substrate wafer 19 is uncovered. Etchants for etching $SiO_2$ or $Si_xN_{1-x}$ are known in semiconductor technology and are not, therefore, explained in any further detail at this point.

In the next step, a semiconductor layer sequence 2 of an edge-emitting laser structure based on Ga(In,Al)N is applied to the uncovered main surface 9 of the substrate wafer 19 by means of selective epitaxy. The windows 10 each have two mutually opposite, plane-parallel side surfaces 7, which define the two laser mirror surfaces 8, lying plane-parallel to one another, of the edge-emitting laser structures 2.

Selective epitaxy means that the semiconductor material of the semiconductor layer sequence is deposited epitaxially, that is to say in monocrystalline fashion, only on the substrate surface and not on the mask layer.

The window 10 is formed by means of a first etching step, which is selective with respect to the substrate wafer 19, and the mask layer 4 is removed by means of a second etching step which is selective with respect to the semiconductor layer sequence 2.

Finally, the mask layer 4 is removed from the substrate wafer 19 by means of wet- or dry-chemical etching, for example, with the result that the semiconductor layer sequence 2 remains as laser semiconductor body standing freely on the substrate 3. The wafer produced in this way is then separated into edge-emitting laser chips 200.

The description of the method according to the invention using these exemplary embodiments is, of course, not to be understood as a restriction of the invention to these examples. Those skilled in the art will readily employ the method wherever the problems outlined in the introduction arise.

I claim:

1. A method of fabricating a plurality of radiation-emitting semiconductor chips, which comprises:

depositing a mask layer on a main surface of a substrate wafer;

forming a plurality of windows in the mask layer such that the main surface of the substrate wafer is uncovered within the windows;

depositing a semiconductor layer sequence onto the main surface of the substrate wafer in the windows and forming substantially identical functional semiconductor structures in the windows, the semiconductor layer including an active layer, being at most as thick as the mask layer; and dividing the wafer with the semiconductor layer sequence into a plurality of radiation emitting semiconductor chips by severing the wafer between the semiconductor structures.

2. The method according to claim 1, wherein the depositing step comprises depositing a Ga(In,Al)N semiconductor layer sequence onto the main surface of the substrate wafer in the windows, and producing Ga(In,Al)N light-emitting diode structures in the windows, and wherein the dividing step comprises dividing the wafer into a plurality of Ga(In,Al)N light-emitting diode chips by severing the wafer between the Ga(In,Al)N light-emitting diode structures.

3. The method according to claim 1, wherein the step of depositing a semiconductor layer structure comprises depositing a VCSEL semiconductor layer sequence onto the main surface of the substrate wafer in the windows and producing VCSEL structures in the windows, and wherein the dividing step comprises dividing the wafer into a plurality of VCSEL chips by severing the wafer between the VCSEL structures.

4. The method according to claim 1, which comprises producing a plurality of edge-emitting semiconductor laser chips, formed with, on two mutually opposite side surfaces, laser mirror surfaces extending plane-parallel to one another and being defined by two mutually opposite, plane-parallel side surfaces of a respective window.

5. The method according to claim 1, which comprises providing a substrate wafer with at least one epitaxially applied semiconductor layer, onto which the semiconductor layer sequence is deposited in the windows during the step of depositing the semiconductor layer structure.

6. The method according to claim 1, wherein the mask layer is formed of a material selected from the group consisting of $SiO_2$ and $Si_xN_{1-x}$.

7. The method according to claim 1, wherein the substrate wafer is formed with a growth substrate composed essentially from a material selected from the group consisting of sapphire, SiC, GaN, AlN, Si, and GaAs.

8. The method according to claim 1, wherein the step of depositing the semiconductor layer sequence comprises forming the semiconductor structures with at least one semiconductor layer from the material system Ga(In,Al)N.

9. The method according to claim 1, which comprises providing a substrate wafer with at least one epitaxially applied semiconductor layer essentially composed of $Ga_xAl_{x-1}N$, whereby $0 \leq x \leq 1$.

10. The method according to claim 1, wherein the forming step comprises forming the windows by etching selectively to the substrate wafer.

11. The method according to claim 1, wherein the forming step comprises anisotropically dry etching the windows.

12. The method according to claim 1, which comprises removing the mask layer prior to the severing step.

13. The method according to claim 12, which comprises removing the mask layer after the step of depositing the semiconductor structures by etching selectively with respect to the semiconductor structures.

14. The method according to claim 12, which comprises removing the mask layer with an isotropic wet-chemical etching process after the step of depositing the semiconductor structures.

15. A method of fabricating a plurality of Ga(In,Al)N light-emitting diode chips, which comprises:

depositing a mask layer on a main surface of a substrate wafer;

forming a plurality of windows in the mask layer such that the main surface of the substrate wafer is uncovered within the windows;

producing Ga(In,Al)N light-emitting diode structures in the windows by depositing a Ga(In,Al)N semiconductor layer sequence onto the main surface of the substrate wafer in the windows; and severing the wafer between the Ga(In,Al)N light-emitting diode structures.

16. A method of fabricating a plurality of VCSEL chips, which comprises:

depositing a mask layer on a main surface of a substrate wafer;

forming a plurality of windows in the mask layer such that the main surface of the substrate wafer is uncovered within the windows;

producing VCSEL structures in the windows by depositing a VCSEL semiconductor layer sequence onto the main surface of the substrate wafer in the windows; and severing the wafer between the VCSEL structures.

17. A method of fabricating a plurality of semiconductor chips, which comprises:

depositing a mask layer on a main surface of a substrate wafer;

forming a plurality of windows in the mask layer such that the main surface of the substrate wafer is uncovered within the windows;

forming substantially identical functional semiconductor structures in the plurality of windows by depositing a semiconductor layer sequence onto the main surface of the substrate wafer in the plurality of windows, at least one layer of the semiconductor layer sequence being from the material system Ga(In,Al)N; and severing the wafer between the semiconductor structures.

18. A method of fabricating a plurality of semiconductor chips, which comprises:

depositing a mask layer on a main surface of a substrate wafer;

forming a plurality of windows in the mask layer such that the main surface of the substrate wafer is uncovered within the windows;

forming substantially identical functional semiconductor structures in the plurality of windows by depositing a semiconductor layer sequence onto the main surface of the substrate wafer in the plurality of windows, the semiconductor layer sequence having at least one epitaxially applied semiconductor layer essentially composed of $Ga_xAl_{x-1}N$, wherein $0 \leq x \leq 1$; and severing the wafer between the semiconductor structures.

* * * * *

UNITED STATES PATENT AND TRADEMARK OFFICE
CERTIFICATE OF CORRECTION

PATENT NO. : 6,100,104
DATED : August 8, 2000
INVENTOR(S) : Volker Härle

It is certified that error appears in the above-identified patent and that said Letters Patent is hereby corrected as shown below:

<u>Title page,</u>
Item [30], Foreign Application Priority Data, should read as follows:
-- Sep. 19, 1997     [DE] …….. 197 41 442
   Aug. 26, 1998     [DE] …….. 198 38 810 --

Signed and Sealed this

Thirtieth Day of March, 2004

JON W. DUDAS
*Acting Director of the United States Patent and Trademark Office*